(12) United States Patent
Brender et al.

(10) Patent No.: US 10,836,684 B2
(45) Date of Patent: Nov. 17, 2020

(54) METHOD OF FABRICATING A FRICTION PART OUT OF COMPOSITE MATERIAL

(71) Applicant: SAFRAN LANDING SYSTEMS, Velizy-Villacoublay (FR)

(72) Inventors: Patrice Brender, Charvieu-Chavagneux (FR); Floriane Demeyer, Bordeaux (FR); Sylvain Jacques, Talence (FR)

(73) Assignee: SAFRAN LANDING SYSTEMS, Velizy-Villacoublay (FR)

( * ) Notice: Subject to any disclaimer, the term of this patent is extended or adjusted under 35 U.S.C. 154(b) by 134 days.

(21) Appl. No.: 16/161,814

(22) Filed: Oct. 16, 2018

(65) Prior Publication Data

US 2019/0119171 A1 Apr. 25, 2019

(30) Foreign Application Priority Data

Oct. 19, 2017 (FR) .................... 17 59867

(51) Int. Cl.
*C04B 41/45* (2006.01)
*F16D 69/02* (2006.01)
(Continued)

(52) U.S. Cl.
CPC .......... *C04B 41/4531* (2013.01); *C04B 35/52* (2013.01); *C04B 35/5622* (2013.01); *C04B 35/80* (2013.01); *C04B 35/806* (2013.01); *C04B 35/83* (2013.01); *C04B 41/0072* (2013.01); *C04B 41/4584* (2013.01); *C04B 41/5001* (2013.01); *C04B 41/5057* (2013.01); *C23C 16/32* (2013.01); *F16D 69/023* (2013.01); *F16D 69/028* (2013.01); *C04B 2235/3839* (2013.01); *C04B 2235/441* (2013.01); *C04B 2235/48* (2013.01); *C04B 2235/5248* (2013.01); *C04B 2235/614* (2013.01); *C04B 2235/79* (2013.01);
(Continued)

(58) Field of Classification Search
CPC ....................................................... C04B 35/52
See application file for complete search history.

(56) References Cited

U.S. PATENT DOCUMENTS 5,792,715 A 8/1998 Duval et al.
6,009,605 A 1/2000 Olry et al.
(Continued)

FOREIGN PATENT DOCUMENTS

EP 2 253 604 A1 11/2010
EP 3 181 720 A1 6/2017
FR 2 880 016 A1 6/2006

OTHER PUBLICATIONS

Search Report as issued in French Patent Application No. 1759867, dated Jun. 8, 2018.

*Primary Examiner* — Joseph A Miller, Jr.
(74) *Attorney, Agent, or Firm* — Pillsbury Winthrop Shaw Pittman LLP

(57) ABSTRACT

A method of fabricating a friction part out of composite material, the method including densifying a carbon yarn fiber preform with a matrix including at least pyrolytic carbon and a $ZrO_xC_y$ phase, where $1 \leq x \leq 2$ and $0 \leq y \leq 1$, the matrix being formed by film-boiling or by chemical vapor infiltration from a first precursor for pyrolytic carbon and a second precursor that includes zirconium, the second precursor being a zirconium complex including an alcoxy or carboxylate ligand bonded to zirconium.

7 Claims, 2 Drawing Sheets

(51) Int. Cl.
*C04B 35/52* (2006.01)
*C04B 35/80* (2006.01)
*C04B 35/83* (2006.01)
*C04B 35/56* (2006.01)
*C04B 41/00* (2006.01)
*C04B 41/50* (2006.01)
*C23C 16/32* (2006.01)
*F16D 65/12* (2006.01)

(52) U.S. Cl.
CPC ........ *C04B 2235/80* (2013.01); *F16D 65/126* (2013.01); *F16D 2200/006* (2013.01); *F16D 2200/0052* (2013.01); *F16D 2200/0091* (2013.01)

(56) References Cited

U.S. PATENT DOCUMENTS

| | | | |
|---|---|---|---|
| 6,363,593 B1 | 4/2002 | Duval et al. | |
| 2004/0022956 A1* | 2/2004 | Patrick | C04B 41/009 427/430.1 |
| 2010/0156005 A1* | 6/2010 | Chang | H05B 6/108 264/406 |
| 2010/0291373 A1* | 11/2010 | Baud | C04B 35/83 428/325 |
| 2017/0175833 A1* | 6/2017 | Le Costaouec | D06M 11/74 |

* cited by examiner

US 10,836,684 B2

METHOD OF FABRICATING A FRICTION PART OUT OF COMPOSITE MATERIAL

CROSS REFERENCE TO RELATED APPLICATIONS

This application claims priority to French Patent Application No. 1759867, filed Oct. 19, 2017, the entire content of which is incorporated herein by reference in its entirety.

FIELD

The present invention relates to a method of fabricating friction parts based on carbon/carbon (C/C) composite materials, such as airplane brake disks.

BACKGROUND

Application EP 2 253 604 proposes a method of obtaining a friction part made out of carbon/carbon (C/C) composite material that incorporates a ceramic phase. That friction part presents low wear and a coefficient of friction that is appropriate for application to braking and that is stable, in particular during high-energy braking.

The method disclosed in that application comprises making a preform out of carbon yarns, densifying the preform with a carbon matrix, and, during the fabrication process, introducing grains or particles of ceramic that are dispersed within the part. More precisely, application EP 2 253 604 discloses, prior to finishing off densification, performing impregnation with a liquid formed by a sol-gel type solution and/or a colloidal suspension enabling one or more zirconium compounds to be dispersed. Grains or crystallites are then obtained in the final part that are of composition that is at least in the majority of the $ZrO_xC_y$ type, with $1 \leq x \leq 2$ and $0 \leq y \leq 1$.

A friction part obtained by the method described in application EP 2 253 604 presents good performance. In contrast, that method is more complex than the standard method of making a disk entirely out of C/C. Specifically, in that application, zirconium-based compound(s) is/are inserted during a liquid process step, that is completely disassociated from the step consisting in preparing pyrolytic carbon by densification using chemical vapor infiltration (CVI).

In particular, application EP 2 253 604 discloses performing zirconium insertion after a first stage of pyrolytic carbon densification by CVI. The part is then unloaded from the CVI oven and immersed in a zirconia precursor sol, then dried, and then subjected to heat treatment. The part is then inserted once more in the CVI oven in order to finish off densification of the pyrolytic carbon matrix. Inserting zirconium in that way, which is completely disassociated from the process of chemical vapor infiltration, entails fabrication that is more complex and lengthier.

It would be desirable to simplify the method of fabricating friction parts out of C/C composite material that incorporates a zirconium-based ceramic phase.

SUMMARY

In a first aspect, the invention provides a method of fabricating a friction part out of composite material, the method comprising at least the following step:
densifying a carbon yarn fiber preform with a matrix comprising at least pyrolytic carbon and a $ZrO_xC_y$ phase, where $1 \leq x \leq 2$ and $0 \leq y \leq 1$, the matrix being formed by film-boiling or by chemical vapor infiltration from a first precursor for pyrolytic carbon and a second precursor that includes zirconium, the second precursor being a zirconium complex comprising an alcoxy or carboxylate ligand bonded to zirconium.

The above-described second precursor serves to obtain the $ZrO_xC_y$ phase by film-boiling or by chemical vapor infiltration. In the invention, the pyrolytic carbon and the $ZrO_xC_y$ phase are both formed by using the same process, either by film-boiling or by chemical vapor infiltration, thereby contributing significantly to making it simpler to obtain the part in comparison with the techniques of the prior art. The joint use of the first and second precursors enables the matrix to be formed solely by film-boiling or solely by CVI, in particular omitting additional steps of impregnation with the sol and the associated heat treatment, and also steps of unloading from the oven and reloading into the oven as performed in the prior art.

The invention makes it possible to obtain a friction part having the desired performance in terms of tribology and resistance to wear, in a manner that is simpler than in the prior art.

In an implementation, the matrix is formed by film-boiling from a film-boiling bath comprising the first and second precursors, and the content by weight of the second precursor in the film-boiling bath lies in the range 3% to 30%, e.g. in the range 3% to 15%.

In an implementation, the matrix is formed by chemical vapor infiltration, and the densification comprises at least:
a first densification cycle in which a first matrix of pyrolytic carbon is formed from the first precursor in the gaseous state;
a second densification cycle, performed after the first cycle, in which a second matrix phase comprising the $ZrO_xC_y$ phase is formed from at least the second precursor in the gaseous state; and
a third densification cycle, performed after the second cycle, in which a third matrix phase made of pyrolytic carbon is formed from a third precursor in the gaseous state for pyrolytic carbon, which third precursor may be identical to or different from the first precursor.

In an implementation, the matrix is formed by chemical vapor infiltration, and the densification comprises at least forming a co-deposit of pyrolytic carbon and of the $ZrO_xC_y$ phase from a mixture of a gaseous precursor for pyrolytic carbon and of the second precursor in the gaseous state.

In an implementation, the alcoxy or carboxylate ligand is a $C_2$ to $C_{10}$ ligand, e.g. a $C_3$ to $C_8$ ligand.

In an implementation, the alcoxy or carboxylate ligand is selected from: propoxy ligand; butoxy ligand; or 2-ethylhexanoate ligand.

In an implementation, the second precursor is selected from: zirconium propoxide ($Zr(OCH_2CH_2CH_3)_4$); zirconium butoxide ($Zr(OC_4H_9)_4$); zirconium ethyl-2-hexanoate ($Zr(OOCCH(C_2H_5)(CH_2)_3(CH_3)_4$); and mixtures thereof.

In an implementation, the method further comprises deoxygenation heat treatment of the $ZrO_xC_y$ phase that has been formed.

In an implementation, the optionally deoxygenated $ZrO_xC_y$ phase is present in the final part at a content by weight lying in the range 0.5% to 25%, e.g. lying in the range 2% to 10%.

In an implementation, the friction part is a brake disk.

BRIEF DESCRIPTION OF THE DRAWINGS

Other characteristics and benefits of the invention appear from the following description given by way of non-limiting example and with reference to the accompanying drawings, in which.

DETAILED DESCRIPTION

The description below relates more particularly to making disks based on C/C composite material for airplane brakes. Nevertheless, the invention is applicable to making other friction parts based on C/C composite material, such as brake disks for land vehicles, in particular cars, and friction parts other than disks, in particular pads.

Figure 1:
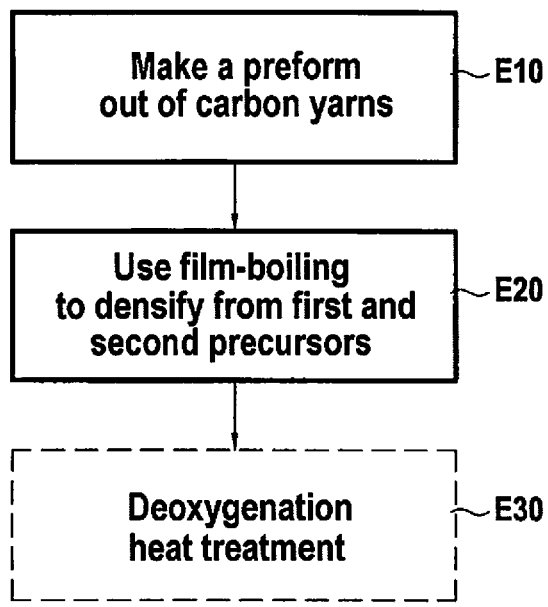
FIG. 1 is a flow chart showing various different steps of a first implementation of a method of the invention.

A first implementation of a method of the invention is shown in FIG. 1, in which the matrix is formed by film-boiling using first and second precursors.

A first step consists in making a preform for the brake disks out of carbon yarns (step E10).

By way of example, such a preform is made by superposing plies cut out from a fiber texture made of carbon-precursor yarns, linking the plies together by needling, and transforming the precursor into carbon by heat treatment.

In a variant, it is also possible to make an annular preform by winding superposed turns of a helical fabric made of carbon precursor yarns, linking the yarns together by needling, and transforming the precursor by heat treatment. By way of example, reference may be made to the following documents: U.S. Pat. Nos. 5,792,715, 6,009,605 and 6,363,593.

The preform may also be made directly from plies of carbon yarn fiber texture that are superposed and linked together, e.g. by needling.

Once the preform has been formed, in the implementation of FIG. 1, densification by film-boiling is then performed in order to densify the preform with the matrix (step E20).

In this example, the fiber preform for densifying is immersed in a liquid film-boiling bath comprising a mixture of a first precursor and a second precursor.

Thereafter, the preform is heated, e.g. by induction. The preform is heated to a temperature higher than the decomposition temperature of the precursors. On contact with the heated preform, the first and second precursors are vaporized and by decomposing they generate a matrix comprising a mixture of pyrolytic carbon and of the $ZrO_xC_y$ phase. During the film-boiling cycle, the first and second precursors are cracked. The yarns become coated in a pyrolytic carbon matrix having inclusions of $ZrO_xC_y$ encapsulated in pyrolytic carbon. The density of the $ZrO_xC_y$ phase inclusions in the resulting matrix may be constant. In particular, the resulting matrix may be of uniform composition. The preform may be maintained in the film-boiling bath throughout the entire time the matrix is being formed.

The resulting matrix may occupy at least 50%, or indeed at least 75% of the initial pore volume of the fiber preform. The initial pore volume of the fiber preform corresponds to the volume of the pores presented by the preform prior to performing any densification step.

In this implementation, the first precursor constitutes a precursor for pyrolytic carbon (PyC) as is conventionally used in film-boiling, such as cyclohexane, toluene, or chlorobenzene. Various details relating to the second precursor are described further below.

The film-boiling bath may include:
  a first precursor at a content by weight lying in the range 70% to 97%, e.g. in the range 85% to 97%; and
  a second precursor at a content by weight lying in the range 3% to 30%, e.g. in the range 3% to 15%.

Unless specified to the contrary, the contents by weight of the precursors in the film-boiling bath are taken before the beginning of densification.

In one example, the film-boiling bath comprises only the first and second precursors.

The content of the second precursor in the film-boiling bath determines the content of the $ZrO_xC_y$ phase in the resulting matrix. Determining the content by weight of the second precursor that should be used in the film-boiling bath in order to obtain the desired $ZrO_xC_y$ phase content in the matrix forms part of the general knowledge of the person skilled in the art.

The temperature imposed for forming the matrix by film-boiling may lie in the range 800° C. to 1600° C., e.g. in the range 900° C. to 1300° C.

Various details relating to the second precursor are described below.

The alcoxy or carboxylate ligand may be a $C_2$ to $C_{10}$ ligand, i.e. may have a carbon chain having 2 to 10 carbon atoms. The alcoxy or carboxylate ligand may be a $C_2$ to $C_8$ ligand or a $C_3$ to $C_8$ ligand or a $C_3$ to $C_{10}$ ligand.

By way of example of a suitable alcoxy or carboxylate ligand, mention may be made of: a propoxy ligand ($CH_3CH_2CH_2O—$); a butoxy ligand ($CH_3CH_2CH_2CH_2O—$); or a 2-ethylhexanoate ligand ($CH_3(CH_2)_3CH(C_2H_5)COO—$). These ligands are mentioned solely by way of example, with the metallic complexes incorporating these ligands corresponding merely to the complexes that are the most available commercially.

In general manner, the second precursor presents the following chemical formula: $Zr(L1)_{4-a}(L2)_a$, where a lies in the range 0 to 3, L1 is the above-mentioned alcoxy or carboxylate ligand, and L2 is an additional ligand, different from L1, that may optionally be present (present if a is not zero).

By way of example, the ligand L2 may be an acetylacetonate ligand ($CH_3CO^-CHCOCH_3$), an acetate ligand ($CH_3COO^-$), or an ethylene-diamine-tetra-acetic (EDTA) acid ligand, or a ligand formed by one of its conjugate bases. The presence of the ligand L2 is optional, and if so desired it makes it possible to modulate the reactivity of the metallic complex.

In a variant, the zirconium complex comprises only zirconium and the alcoxy or carboxylate ligand (no additional ligand L2). Thus, the second precursor may be selected by way of example from: zirconium propoxide ($Zr(OCH_2CH_2CH_3)_4$); zirconium butoxide ($Zr(OC_4H_9)_4$); zirconium ethyl-2-hexanoate ($Zr(OOCCH(C_2H_5)(CH_2)_3CH_3)_4$); and mixtures thereof.

If so desired, deoxygenation heat treatment (optional step E30) may be performed in order to eliminate at least some of the bonds that exist between zirconium and oxygen in the resulting $ZrO_xC_y$ phase. This treatment serves to modulate the stoichiometry of this phase. In particular, after deoxygenation, it is possible to transform the $ZrO_xC_y$ phase into a ZrC phase. As shown in FIG. 1, the deoxygenation heat treatment may be performed on the resulting final part.

The deoxygenation heat treatment constitutes treatment that is itself known. Determining the duration and the temperature to be used for this deoxygenation treatment as a function of the material that it is desired to obtain forms part of the general knowledge of the person skilled in the art.

The above description relates to an example in which the matrix is formed by film-boiling from a bath comprising both the first precursor for PyC and the second precursor including zirconium. Film-boiling thus forms a co-deposit of pyrolytic carbon and of the $ZrO_xC_y$ phase.

Nevertheless, it would not go beyond the invention to form sequentially by film-boiling a first matrix phase of PyC followed by a second matrix phase comprising the $ZrO_xC_y$ phase, and then a third matrix phase of PyC. This would obtain a sequenced matrix comprising at least first and third layers of PyC and a second layer comprising the $ZrO_xC_y$ phase interposed between the first and third layers.

Such a sequenced matrix may be made by forming the first matrix phase out of PyC using a first film-boiling bath having a precursor for PyC, the second matrix phase made of $ZrO_xC_y$ from a second film-boiling bath comprising the second precursor, and the third matrix phase made of PyC from a third film-boiling bath comprising a precursor for PyC. The PyC precursor used for forming the third matrix phase made of PyC may be identical to or different from the PyC precursor used for forming the first matrix phase made of PyC. This sequenced deposition may be performed in a single reactor in which the film-boiling bath is emptied and a new film-boiling bath is introduced between forming two successive matrix phases.

Figure 2:
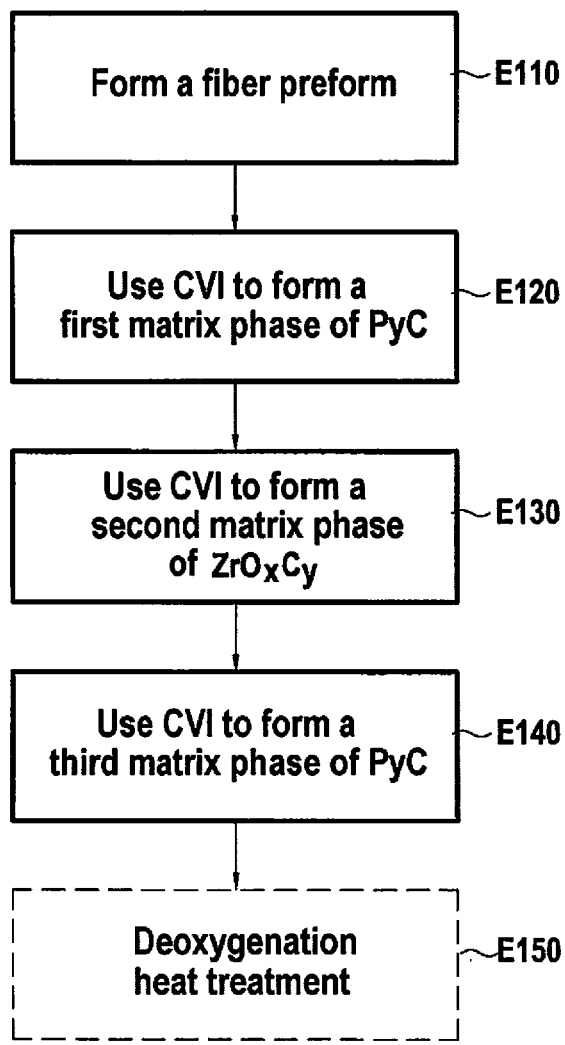
FIG. 2 is a flow chart showing various different steps of a second implementation of a method of the invention.
Figure 3:
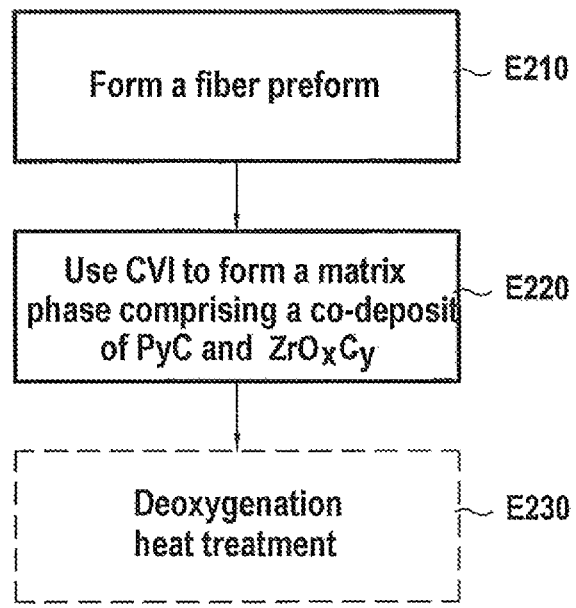
FIG. 3 is a flow chart showing various different steps of a third implementation of a method of the invention.

The above description relates to a matrix formed by film-boiling using first and second precursors. With reference to FIGS. 2 and 3, there follows a description of two implementations of methods of the invention in which the matrix is formed by chemical vapor infiltration from first and second precursors.

As in the implementation of FIG. 1, the fiber preform is fabricated initially (step E110).

Thereafter, the preform is densified by the matrix by performing a CVI method.

For this purpose, the fiber preform that is to be densified is placed in a CVI reaction enclosure. It is possible to use a conventional reaction enclosure that is suitable for forming PyC.

In the implementation associated with the flow chart of FIG. 2, densification comprises a first densification cycle in which a first matrix phase made of PyC is formed by chemical vapor infiltration from a first precursor (step E120). The first phase made of PyC may be formed directly on the yarns forming the preform.

After the first densification cycle, and before beginning the second densification cycle, a preform is obtained that is partially densified by the first matrix phase made of PyC. The first matrix phase made of PyC may occupy 5% to 40%, e.g. 15% to 25% of the initial pore volume of the fiber preform.

Thereafter, a second densification cycle is performed during which a second matrix phase comprising the $ZrO_xC_y$ phase is formed by chemical vapor infiltration from at least the second precursor (step E130). The second matrix phase may be formed directly on the first matrix phase made of PyC. In this example, introducing the second gaseous precursor into the reaction enclosure is initiated on going from the first densification cycle to the second.

In an implementation, the second precursor may constitute the sole reaction gas that is introduced into the reaction enclosure during the second densification cycle (without any precursor for PyC being introduced under such circumstances). During this second cycle, a phase made of $ZrO_xC_y$ only is then formed.

In a variant, during the second densification cycle, it is possible to introduce a gaseous mixture into the reaction enclosure comprising both a precursor for PyC and the second precursor. Under such circumstances, a co-deposit is obtained of the $ZrO_xC_y$ phase and of PyC that is formed by chemical vapor infiltration. The precursor for PyC may be the first precursor or the third precursor or a precursor for PyC that is different from the first and third precursors.

The second matrix phase may occupy 1% to 10%, e.g. 2% to 7% of the initial pore volume in the preform.

Thereafter, a third densification cycle is performed during which a third matrix phase made of PyC is formed by chemical vapor infiltration using a third gaseous precursor for PyC, that may be identical to or different from the first precursor (step E140). The third matrix phase may be formed directly on the second matrix phase. In this example, the introduction of the second precursor into the reaction enclosure is stopped at the end of the second densification cycle and is not restarted during the third densification cycle. The preform may be kept in the reaction enclosure throughout the entire duration of forming the matrix.

The first and third precursors constitute precursors for PyC that are conventionally used in CVI and that are therefore themselves well known. The first and third precursors may be selected, independently from each other, from: natural gas; methane; ethane; propane; benzene; or a mixture of these compounds.

The second precursor used in the CVI densification may be as described above for densification by film-boiling.

If so desired, it is possible to perform deoxygenation heat treatment in the same manner as described above (step E150).

The matrix formed by CVI from the first and second precursors may occupy at least 50%, or indeed at least 75% of the initial pore volume of the fiber preform. The third densification cycle may in particular serve to finish off densification of the preform.

The matrix may be formed by CVI in the context of the invention by using a conventional CVI installation that is appropriate for PyC densification, but that includes an additional feed line enabling the second precursor in the gaseous state to be injected into the reaction enclosure. The second precursor may be introduced into the reaction enclosure by means that are themselves known and commonly used in PyC CVI for introducing reagent gases.

In the implementation described above with reference to FIG. 2, chemical vapor infiltration is used to form sequentially the first matrix phase out of PyC, then the second matrix phase comprising the $ZrO_xC_y$ phase, then the third matrix phase made of PyC. A sequenced matrix is thus obtained having at least first and third layers of PyC and a second layer comprising the $ZrO_xC_y$ phase interposed between the first and third layers.

In a variant, it is possible to perform co-deposition of PyC+$ZrO_xC_y$ by chemical vapor infiltration. This variant is described below with reference to FIG. 3.

In the example of FIG. 3, the method begins with forming a fiber preform (step E210) followed by densifying the preform, which densification includes at least forming one co-deposit of PyC and of the $ZrO_xC_y$ phase (step E220).

In particular, it is possible to obtain inclusions of $ZrO_xC_y$ that are distributed throughout the volume of the matrix. These $ZrO_xC_y$ inclusions are dispersed in the pyrolytic carbon matrix.

The entire matrix may be formed as a co-deposit of PyC and of the $ZrO_xC_y$ phase. In a variant, only a portion of the matrix is formed as a co-deposit of PyC and of the $ZrO_xC_y$ phase, with the remainder of the matrix having a composition that is different.

The co-deposit of PyC and of the $ZrO_xC_y$ phase may be uniform in composition (the co-deposit presents a composition that is homogenous). Under such circumstances, the relative proportions of the PyC precursor gas and of the second precursor based on zirconium are kept constant in the gas mixture during co-deposition.

In a variant, the composition of the co-deposit of PyC and of the $ZrO_xC_y$ phase may vary within the part. Under such circumstances, the relative proportions in the gas mixture of the PyC precursor gas and of the second precursor based on zirconium are modified while performing co-deposition. This modification of the relative proportions during deposition makes it possible to control the proportion of the $ZrO_xC_y$ phase that is formed locally in the resulting matrix.

In a manner similar to that described above, deoxygenation heat treatment (step E230) may be performed once the co-deposit has been made, if so desired.

The above-described details relating to the fiber preform and to the precursors for PyC and for $ZrO_xC_y$ remain applicable to the implementation of FIG. 3.

The relative proportions of the PyC precursor(s) and of the second precursor for $ZrO_xC_y$ that are injected determine the content by weight of the $ZrO_xC_y$ phase that is obtained in the final part. The general competence of the person skilled in the art serves to determine the flow rates that need to be used for the various precursors in order to obtain the content desired for the $ZrO_xC_y$ phase in the final part.

Whatever the method used for forming the matrix (film-boiling or CVI), it is possible in particular to obtain a content by weight for the $ZrO_xC_y$ phase in the final part lying in the range 0.5% to 25%, or indeed in the range 2% to 10%, which $ZrO_xC_y$ phase may optionally be subjected to the above-mentioned deoxygenation treatment.

EXAMPLES

Example 1: Forming the Matrix Comprising Pyrolytic Carbon and a $ZrO_xC_y$ Phase by Film-Boiling A second precursor based on zirconium is initially prepared.

A 1 molar equivalent quantity of acetylacetone was introduced into a volume of zirconium butoxide, while stirring. This produced a metallic complex having the formula $Zr(OBut)_3(acac)$, where OBut designates the butoxy ligand, and acac designates the acetylacetonate ligand. That complex constituted the second precursor used in densification by film-boiling.

The second precursor as formed was added to a bath of cyclohexane (first precursor) under stirring in order to obtain a film-boiling bath presenting a content by weight of the first precursor of 70% and of the second precursor of 30%.

Figure 4:
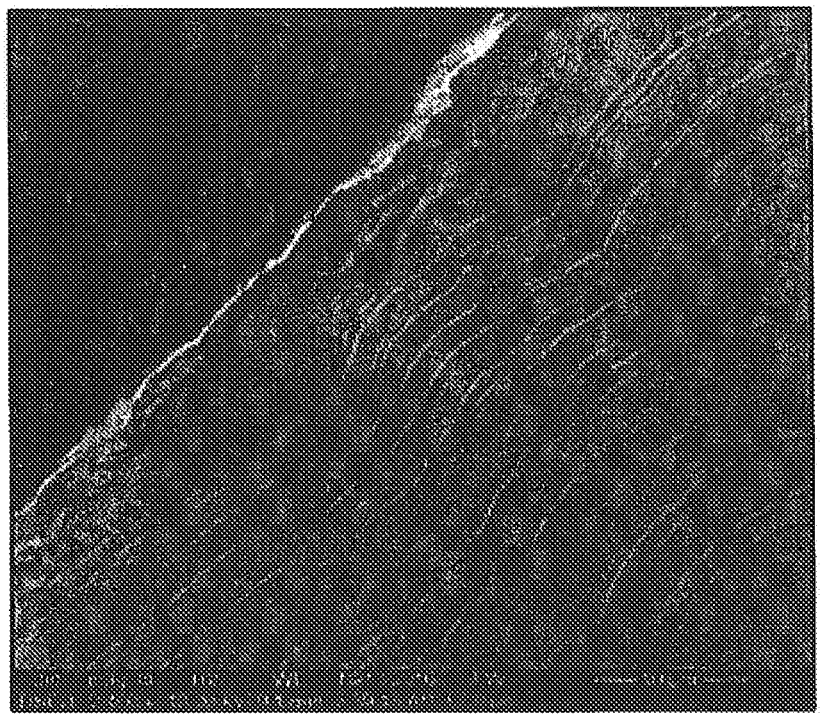
FIG. 4 is a photograph of a matrix formed in the context of a method of an embodiment of the invention.

A fiber preform made of carbon fibers was immersed in the film-boiling bath and the fiber preform was densified by imposing a temperature of 1100° C. A mixed matrix of PyC and of a $ZrO_xC_y$ phase was obtained (see the photograph provided in FIG. 4).

Example 2: Forming the Matrix Comprising Pyrolytic Carbon and a $ZrO_xC_y$ Phase by Chemical Vapor Infiltration In this example, a first precursor formed of a mixture of methane and propane, and a second precursor formed by zirconium butoxide were used. The matrix was formed by CVI in a reaction enclosure at a temperature of about 1000° C. and under a pressure that was less than 5 kilopascals (kPa). The following flow rates were imposed during the CVI process: methane was injected into the enclosure at a rate of 20 cubic centimeters per minute ($cm^3 \cdot min^{-1}$), propane was injected into the enclosure at a rate of 4.3 $cm^3 \cdot min^{-1}$, and zirconium butoxide was injected into the enclosure at a rate of 3.5 $cm^3 \cdot min^{-1}$.

A mixed matrix of PyC including inclusions of $ZrO_xC_y$ was thus obtained.

The term "lying in the range . . . to . . . " should be understood as including the bounds.

The invention claimed is:

1. A method of fabricating a friction part out of composite material, the method comprising:
   densifying a carbon yarn fiber preform with a matrix comprising at least pyrolytic carbon and a $ZrO_xC_y$ phase, where $1 \leq x \leq 2$ and $0 \leq y \leq 1$, the matrix being formed by film-boiling from a film-boiling bath comprising a first precursor for pyrolytic carbon and a second precursor that includes zirconium, the second precursor being a zirconium complex comprising an alkoxy or carboxylate ligand bonded to zirconium, wherein the $ZrO_xC_y$ phase is formed by film-boiling from the second precursor, and wherein the content by weight of the second precursor in the film-boiling bath lies in the range 3% to 30%.

2. The method according to claim 1, wherein the alcoxy or carboxylate ligand is a $C_2$ to $C_{10}$ ligand.

3. The method according to claim 2, wherein the alcoxy or carboxylate ligand is selected from: propoxy ligand; butoxy ligand; or 2-ethylhexanoate ligand.

4. The method according to claim 3, wherein the second precursor is selected from: zirconium propoxide; zirconium butoxide; zirconium ethyl-2-hexanoate; and mixtures thereof.

5. The method according to claim 1, further comprising deoxygenation heat treatment of the $ZrO_xC_y$ phase that has been formed.

6. The method according to claim 1, wherein the optionally deoxygenated $ZrO_xC_y$ phase is present in the final part at a content by weight lying in the range 0.5% to 25%.

7. The method according to claim 1, wherein the friction part is a brake disk.

* * * * *